United States Patent [19]
Choi

[11] Patent Number: 6,128,241
[45] Date of Patent: Oct. 3, 2000

[54] REPAIR CIRCUIT OF SEMICONDUCTOR MEMORY DEVICE USING ANTI-FUSE

[75] Inventor: Jin-hyeok Choi, Seoul, Rep. of Korea

[73] Assignee: Hyundai Electronics Industries Co., Ltd., Kyunggi-do, Rep. of Korea

[21] Appl. No.: 09/473,207

[22] Filed: Dec. 27, 1999

[30] Foreign Application Priority Data

Jan. 9, 1999 [KR] Rep. of Korea ............ 99-346

[51] Int. Cl.[7] ................................ G11C 7/00
[52] U.S. Cl. ...................... 365/225.7; 365/200
[58] Field of Search ............... 365/225.7, 200, 365/203

[56] References Cited

U.S. PATENT DOCUMENTS

| | | | |
|---|---|---|---|
| 5,724,282 | 3/1998 | Loughmiller et al. | 365/96 |
| 5,781,483 | 7/1998 | Shore | 365/200 |
| 5,825,697 | 10/1998 | Gilliam et al. | 365/200 |
| 5,875,144 | 2/1999 | Zheng | 365/225.7 |
| 5,956,282 | 9/1999 | Casper | 365/225.7 |
| 5,978,248 | 11/1999 | Marr et al. | 365/225.7 |
| 6,016,264 | 1/2000 | Lin | 365/225.7 |

FOREIGN PATENT DOCUMENTS

| | | |
|---|---|---|
| 06295593 | 10/1994 | Japan . |
| 06295594 | 10/1994 | Japan . |

*Primary Examiner*—Son T. Dinh
*Attorney, Agent, or Firm*—Crompton, Seager & Tufte, LLC

[57] ABSTRACT

A repair circuit of a semiconductor memory device includes a programming circuit operating independently from a high voltage supply, to replace a defective cell with a redundant cell using an anti-fuse, by generating a repair value based on an address signal being input to the memory device. The repair circuit includes an operation switch having an output for outputting a charge voltage in response to a charge/discharge signal; at least one programming circuit of a series connection of an anti-fuse and a transistor, connected between the output of the operation switch and ground, to set a programmed state of the anti-fuse according to the address signal; a supply for an externally generating a high voltage to the anti-fuse of the programming circuit; a first buffer, connected between the programming circuit and the operation switch, to transmit the charge voltage output from the programming circuit and to block the externally generated high voltage supplied to the programming circuit; a second buffer, connected between the programming circuit and the high-voltage supply, to transmit the externally generated high voltage and to block the charge voltage output to the programming circuit; and an output unit to output the repair value, the repair value being indicative of the programmed state set by the programming circuit. A bank selector may be connected between the programming circuit and ground, to select one bank of anti-fuses in response to a block address signal.

12 Claims, 5 Drawing Sheets

REPAIR CIRCUIT OF SEMICONDUCTOR MEMORY DEVICE USING ANTI-FUSE

BACKGROUND OF THE INVENTION

1. Field of the Invention

The present invention relates to a repair circuit of a semiconductor memory device, such as a DRAM device, and more particularly to a repair circuit of a semiconductor memory device by which a defective cell is replaced with a redundant cell by programming an anti-fuse.

2. Discussion of the Related Art

If even one of a large number of defined cells in a semiconductor memory device is defective in its operation, the memory device as a whole must be treated as a defective (unusable) product, because the device cannot be normally operated as a dynamic random access memory (DRAM). It is, however, highly impractical to discard the entire memory device when only a very few of the defined cells are actually defective, which is especially true as the integration of a DRAM device increases. Therefore, when defective cells are present, which is an inevitable occurrence, such cells are replaced with spare or "redundant" memory cells. The redundant memory cells are embedded (pre-installed) within a manufactured DRAM device, in the form a redundancy circuit, for the express purpose of replacing all identified defective cells and thereby improving the yield of the final product.

The adverse result of this universal provision of redundant memory cells is an undesirable increase of the area of a given chip, which in turn increases the complexity of the test for identifying the defective cells themselves. Nevertheless, such a technique of installing a redundancy circuit is generally used in 64~256 Kb DRAMs as a standard practice, since the increased chip area is not excessive. Typically, a redundancy circuit for a memory cell is pre-installed in each sub-array block, whereby spare rows and columns are established, thereby enabling the replacement of each defective cell with a redundant memory cell in a row/column when cell defects are identified.

To identify the defective memory cells, an electrical test is performed to check each memory cell of every memory device of a completed wafer. Then, the memory devices are "reprogrammed" using a repair circuit to effectively change the addresses of the defective cells, such that when the address signal for a defective cell is selected, a spare (replacement) cell is internally addressed in its place. In doing so, when the defective addresses are input to the memory device during its actual operation, pre-installed alternative address lines are selected instead of the addresses originally corresponding to defective lines.

Such a programming method can be achieved by one of several methods: by burning open a pre-installed fuse using a current overload, as an ordinary electrical fuse; using a laser beam to cut traces (polysilicon or metal wirings) in order to create an electrical open or an electrical short; or by programming an EPROM memory cell. Among these methods, the laser cutting method is simple and precise and therefore widely used.

FIG. 1 is a circuit diagram illustrating a repair circuit for repairing defective elements (cells) using an ordinary fuse. The repair circuit comprises an operation switch 110 for performing a charging function in response to a charge/discharge signal; an address input unit 120 comprised of a plurality of NMOS transistors connected via a plurality of parallel polysilicon fuses 140 between the operation switch and ground, to respond to an address signal made up of a plurality of address lines, in order to detect the cutting state of the polysilicon fuses; and an output unit 130 comprised of an invertor, connected to the common node of the operation switch and the fuses, for outputting a repair value voltage in accordance with the charged state of the circuit and the status of the polysilicon fuses.

In the operation of the repair circuit constructed as above, when the charge signal is at a low potential, the operation switch 110 is turned-on, thereby applying the supply voltage (Vcc) potential to the polysilicon fuses 140. In this state, as each line of the input address signal is driven at a high potential to turn on the corresponding NMOS transistor, the supply voltage is supplied from the operation switch 110 to ground via the turned-on transistor and its corresponding fuse, so that the potential at a node "a" is held low for each address line test. This low level of electric potential is inverted and output by the output unit 130 as a repair value. Accordingly, the repair value is normally high.

On the other hand, when a polysilicon fuse is cut with a laser beam, the corresponding current path between the operation switch 110 and the address input unit 120 is interrupted, so that when the address line test is performed as above, the potential at the node "a" stays high (charged). Accordingly, the inverted, low-level repair value signal output by the output unit 130 indicates an identifiable cut fuse.

Thus, if the repair value is low, indicating a programmed fuse, and an address designating a defective cell is input to the memory device, the defective cell is replaced by a redundant cell. In doing so, normal operation is achieved so that the memory device operates properly.

There are, however, several disadvantages in adopting a repair circuit as described above. For example, though laser technology is highly precise, cuttable fuses made of polysilicon are relatively large. Also, in cutting the polysilicon fuses using a laser beam, errors may occur in applying the laser beam to the target fuse, whereby the incomplete or unintended cutting of a fuse may result. In addition to such unreliability, laser cutting is a time-consuming operation, which increases manufacturing cost, that is, because defective cells cannot be repaired at the package level. Furthermore, as mentioned above, as semiconductor processing improves to increase integration and memory capacity, the occupying area of the larger number of polysilicon fuses increases as well, so that overall chip size must also increase. The increased memory capacity of a given chip necessitates much more time to repair the chip, thereby increasing manufacturing cost. Meanwhile, since the repair procedure of cutting a fuse with a laser beam must, inherently, be performed before the chip is packaged, a defect resulting from burn-in testing after chip packaging is completed cannot be repaired.

In order to resolve these problems, an anti-fuse, which is electrically programmed without using a fuse in the standard sense, has been introduced. The anti-fuse (also known as a diode fuse) is a fuse in which resistive isolation, determined by an insulation layer between a pair of electrodes, can be broken down by a low voltage, i.e., lower than that which would normally break down the insulation, applied across the electrodes. In other words, a predetermined voltage applied across the terminals of an anti-fuse will produce a short circuit of very low resistance.

FIG. 2 is a circuit diagram illustrating a repair circuit for repairing a defective cell by using a typical anti-fuse. Though FIG. 2 shows but a single anti-fuse 240, the same principle maybe applied to any number of such fuses, and a plurality of such anti-fuses are intended to be represented.

The repair circuit comprises an operation switch 210 for performing a charge operation using a supply voltage (Vcc); an address input unit 220 connected via the anti-fuse 240 between the operation switch and ground, by which the anti-fuse is programmed in response to the input of a defective address; an output unit 230 for outputting the repair value as a programming state of the anti-fuse in response to the address signal; a latch 250 for stabilizing the voltage level at a node a¢ in response to an inverted repair value signal REP from the output unit; and a high-voltage supply 260 for supplying a high voltage to the anti-fuse and thereby producing a short circuit (very low resistance).

In the above repair circuit, the anti-fuse 240 maintains its insulated state while only the supply voltage level is applied, but becomes a virtual short circuit should a high voltage be applied. That is, in a normal state, where no program signal is input, the supply voltage is supplied to a programming circuit (an anti-fuse and NMOS combination) through the operation switch 210, thereby charging the programming circuit. When a charge voltage is thus applied to the anti-fuses 240, the voltage at node a¢ becomes destabilized, so that the latch 250, operating in response to the REP signal, stabilizes the input to the output unit 230. Upon input of the program signal under these conditions, a high voltage is supplied to the anti-fuse 240 via the high voltage supply 260, thus "programming" the anti-fuse by way of a breakdown of its insulating barrier.

Thereafter, when a defective address is input, the address input unit 220 is driven according to the programmed (shorted) state of the anti-fuse 240, thereby outputting the low-level repair value through the output unit 230. At the same time, a current path passing the high voltage through the high-voltage supply 260 is formed, but the current path is interrupted in response to the REP signal output from the output unit 230, thereby preventing unnecessary current consumption.

Utilizing such an anti-fuse allows an electrical repair to be performed. Thus, an expensive laser repair system is not needed and the repair can be performed after package is completed. In order to electrically break down the insulation layer of the anti-fuse 240, however, the application of a high voltage is needed. Accordingly, the gate of an input MOS transistor of the output unit 230 is likewise subject to a high voltage, and general MOS transistors cannot withstand such levels without severe stress and the associated degradation of circuit reliability. In addition, the additional circuitry necessary to generate the high voltage for programming 2,000–5,000 anti-fuses, an ordinary number in such applications, greatly increases the required area of a memory device.

SUMMARY OF THE INVENTION

Accordingly, it is an object of the present invention to provide a repair circuit of a semiconductor memory device, by which a defective cell can be replaced with a redundant cell by programming an anti-fuse, while solving the problems of the conventional art.

It is another object of the present invention to provide a repair circuit of a semiconductor memory device, which improves circuit reliability.

It is still another object of the present invention to provide a repair circuit of a semiconductor memory device, which enables a reduction in occupied chip area to increase chip productivity.

In order to achieve the above objects and other advantages of the present invention, there is provided a repair circuit of a semiconductor memory device, for generating a repair value based on an address signal being input to the memory device, comprising: an operation switch having an output for outputting a charge voltage in response to a charge/discharge signal; at least one programming circuit of a series connection of an anti-fuse and a transistor, connected between the output of the operation switch and ground, to set a programmed state of the anti-fuse according to the address signal; means for supplying an externally generated high voltage to the anti-fuse of the at least one programming circuit; a first buffer, connected between the at least one programming circuit and the operation switch, to transmit the charge voltage output to the at least one programming circuit and to block the externally generated high voltage supplied to the at least one programming circuit; a second buffer, connected between the at least one programming circuit and the high-voltage supply means, to transmit the externally generated high voltage and to block the charge voltage output to the at least one programming circuit; and an output unit to output the repair value, the repair value being indicative of the programmed state set by the at least one programming circuit.

In accordance with another aspect of the present invention, the repair circuit may further comprise a bank selector, connected between the at least one programming circuit and ground, to select one bank of anti-fuses in response to a block address signal.

In accordance with yet another aspect of the present invention, the repair circuit may further comprise a parallel circuit comprising: a plurality of the operation switches, each receiving the charge/discharge signal; a plurality of the at least one programming circuits, each receiving the address selection signal; a plurality of the first buffers; and a plurality of the second buffers, each receiving the externally generated high-voltage.

When a high voltage is externally supplied while a defective address is input to the address input unit, the second buffer transmits the high voltage to the corresponding anti-fuse, and the first buffer prevents the high voltage from being transmitted to the output unit and operation switch, thereby programming the anti-fuse corresponding to the address of the defective cell. Thereafter, when the address of the defective cell is generated during the operation of the memory device and input to the address input unit, the voltage value charged by the programmed anti-fuse changes state and the changed value is output through the output unit as a repair value.

BRIEF DESCRIPTION OF THE DRAWINGS

The present invention will now be described in detail with reference to the accompanying drawings, which are included to provide a further understanding of the invention and are incorporated in and constitute a part of this specification in order to illustrate embodiments of the invention, and which, together with the following detailed description, serve to explain the principles of the invention. In the drawings.

DETAILED DESCRIPTION OF THE PREFERRED EMBODIMENTS

The repair circuit of a semiconductor memory device according to the present invention includes a high voltage supply means (not shown) which is externally provided, under test conditions, to supply a high voltage to an internal node or terminal, hereinafter referred to as a pad, of the memory device. The repair circuit has a programming circuit, made up of at least one series connection of an anti-fuse and an NMOS transistor, operating independently from a high voltage supply, in order to replace a defective cell with a redundant cell using an anti-fuse.

Figure 1:
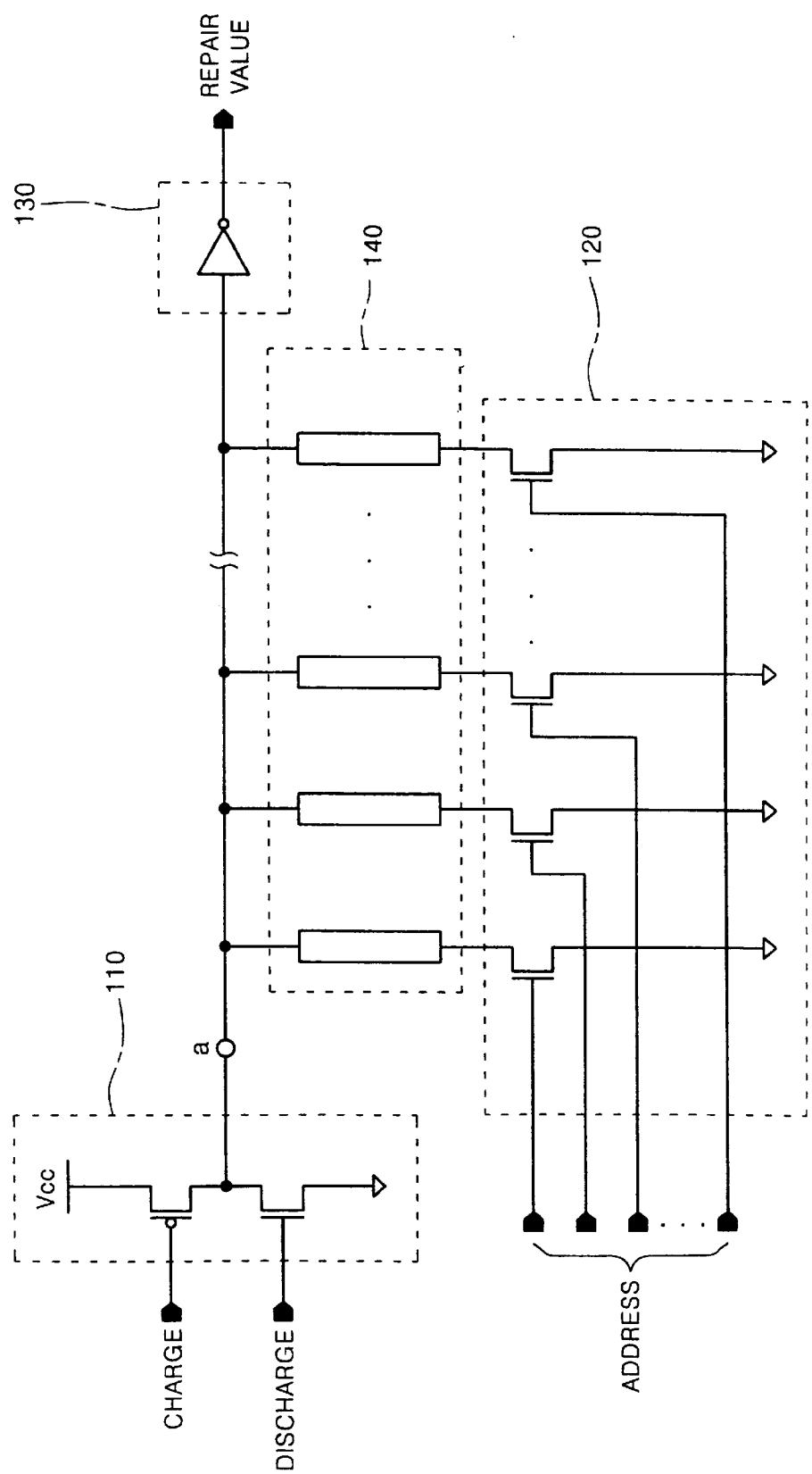
FIG. 1 is a circuit diagram of a repair circuit utilizing a conventional polysilicon fuse.
Figure 2:
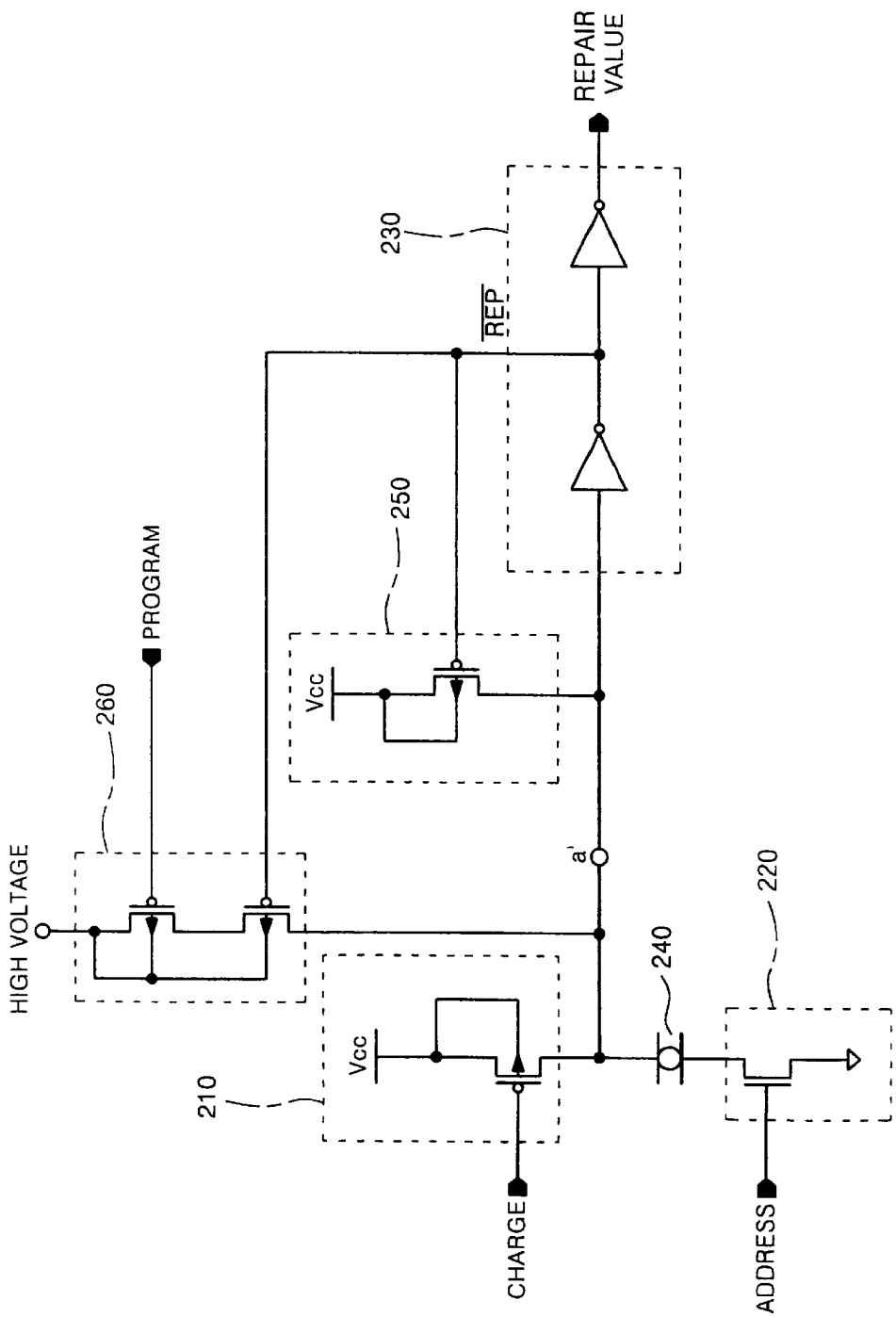
FIG. 2 is a circuit diagram of a repair circuit utilizing a conventional anti-fuse.
Figure 3:
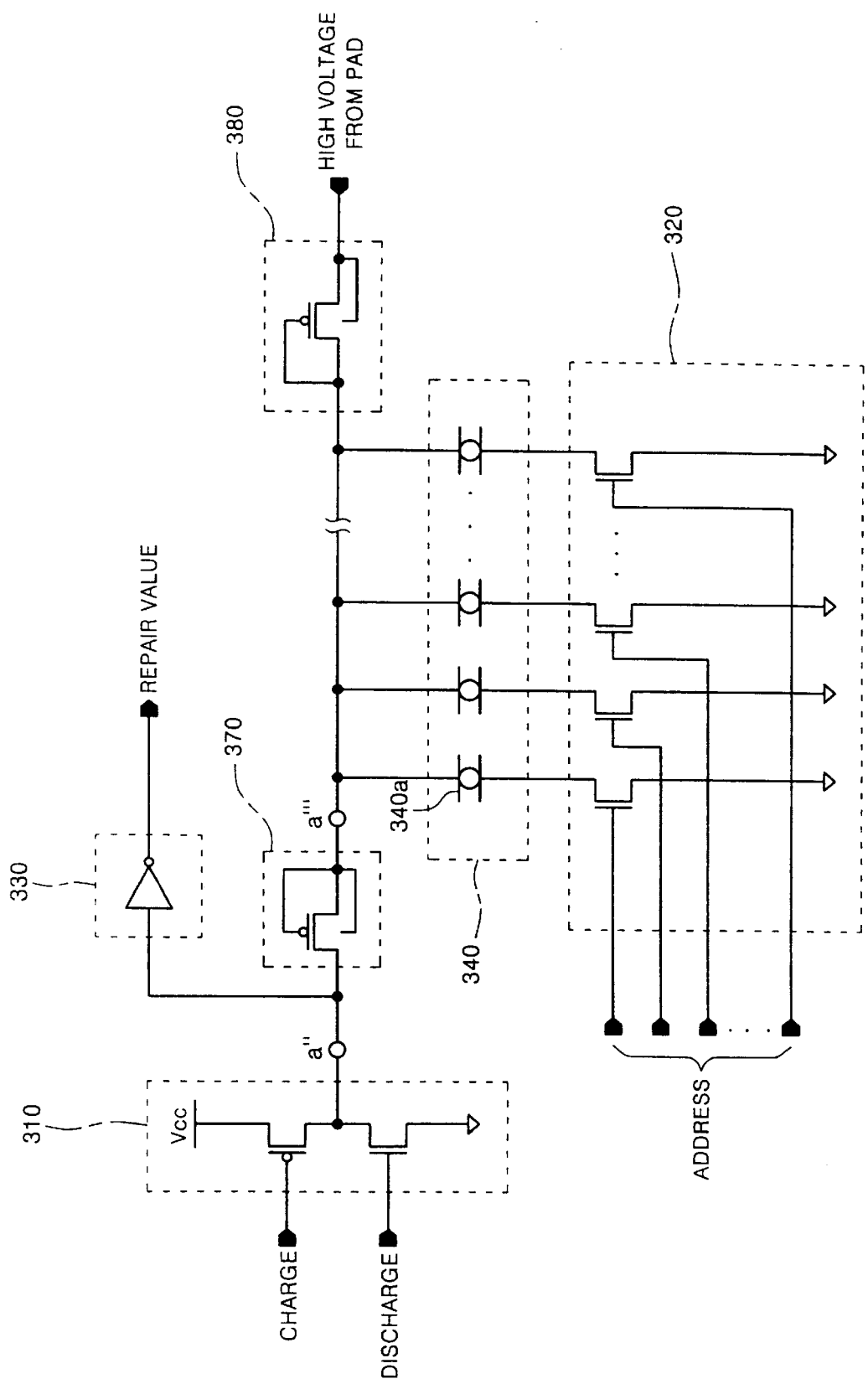
FIG. 3 is a circuit diagram of a repair circuit according to one embodiment of the present invention.

Referring to FIG. 3, the repair circuit further comprises an operation switch 310 for performing a charging function in response to a charge/discharge signal; a plurality of anti-fuses 340 which break down with an over-current flow, to become short circuits connected to the common node between a pair of buffers; an address input unit 320, connected between the anti-fuses and ground, being turned-on in response to the input of a defective address, thereby allowing the anti-fuse to be "programmed" (shorted to identify a defective cell), and thus identifying the programmed state; a first buffer 370, connected between the anti-fuse and the operation switch, for transmitting an operation signal to the anti-fuses while blocking a high voltage applied to the anti-fuses; a second buffer 380, connected between the anti-fuses and a high voltage input, i.e., the pad, for transmitting an applied high voltage to the anti-fuses while isolating the internal circuitry from an external circuit generating the high voltage; and an output unit 330 the input of which is connected between the operation switch and the first buffer, to thereby be protected against the high voltage input, for outputting a programming state (repair value) of the anti-fuses in response to an address signal. The first buffer 370 is comprised of a PMOS transistor including a source, gate, and substrate connected to a node $a\_$, and a drain connected to a node $a^2$; and the second buffer 380 is comprised of a PMOS transistor whose source and substrate are connected to the pad to receive a high voltage and whose drain and gate are connected to the node $a\_$.

In the operation of the circuit as described above, if the voltage applied to node $a\_$ is higher than the voltage at node $a^2$, the programming circuit maintains an off state. For example, when the voltage at the node $a^2$ is 3.0 V and the voltage at the node $a\_$ is 8.0 V, such that the PMOS transistor of the first buffer 370 feels a potential of 5 V, high voltage from the pad is not transmitted to the operation switch 310. Accordingly, the output unit 330 and, particularly, an input MOS transistor thereof are not affected by the high voltage. While the pad is not supplied with the high voltage, that is, while no repair operation is being performed, the node $a\_$ is applied with a voltage of 2.3 V, that is, as low as the threshold voltage of the PMOS transistor when the node $a^2$ is applied with a voltage of 3 V. Then, the anti-fuse 340, operation switch 310, and output unit 330 are electrically connected with each other, thereby detecting the change in voltage applied to the anti-fuse.

Meanwhile, when a high voltage is applied through the pad, that is, when a repair operation is being performed, the PMOS transistor of the second buffer 380 is turned on. Thus, the applied high voltage is supplied to the node $a\_$ at a low voltage, such as the threshold voltage of the PMOS transistor. That is, if 8.7 V is supplied through the pad and the threshold voltage of the PMOS transistor is 0.7 V, the node $a\_$ is at 8 V.

If a high voltage is not applied through the pad, the PMOS transistor of the second buffer 380 is turned off, thereby the pad and the node $a\_$ are separated with each other. In such a way, in case that a high voltage is supplied, the high voltage is simultaneously supplied to the circuit in which several anti-fuse are located. In case that the high voltage is not applied, the anti-fuses are independently operated.

Accordingly, in order to perform the repair operation, the charge signal is input to the operation switch 310 and the nodes $a^2$ and $a\_$ are allowed to be charged by 3 V. Also, the transistor connected to the corresponding anti-fuse remains turned-on in response to the address value corresponding to the defective cell, which is input through the address input unit 320. At this time, if high voltage of 8.7 V is applied through the pad to program an anti-fuse, the anti-fuse forms a current path which, together with the turned-on (addressed) NMOS transistor of the address input unit 320, will break down its insulation. In contrast, the anti-fuses corresponding to those NMOS transistors not turned on by the address signal maintain an electrical open. This operation programs the plurality of anti-fuses 340 in accordance with the address value(s) of the defective cell or cells.

When the repair operation performed as above is completed, the proper repair of the defective cell or cells is confirmed. To do so, the charge signal is input to the operation switch 310 to thereby charge the nodes $a^2$ and $a\_$. Then, if the voltage of the node $a^2$ is at 3 V, the voltage of the node $a\_$ will be 2.3 V, due to the threshold voltage of the PMOS transistor of the first buffer 370. At this time, as the NMOS transistors of the address input unit 320 are turned on by the applied address signal input, the voltage applied to the node $a\_$ drops in the case of a properly programmed anti-fuse. On the other hand, if no such repair has been performed, the node $a\_$ voltage does not change.

In other words, assuming that an anti-fuse 340a is programmed and its insulation layer is changed to a very high resistance, for all address values of "100 . . . 0," "001 . . . 0," and "000 . . . 1," the node $a\_$ voltage does not change, i.e., stays high. When the value "010 . . . 0" is input, however, the node $a\_$ voltage goes low, because the anti-fuse 340a is programmed and the voltage of the node $a^2$ is also low. Thus, the output unit 330 inverts and outputs the repair value.

Figure 4:
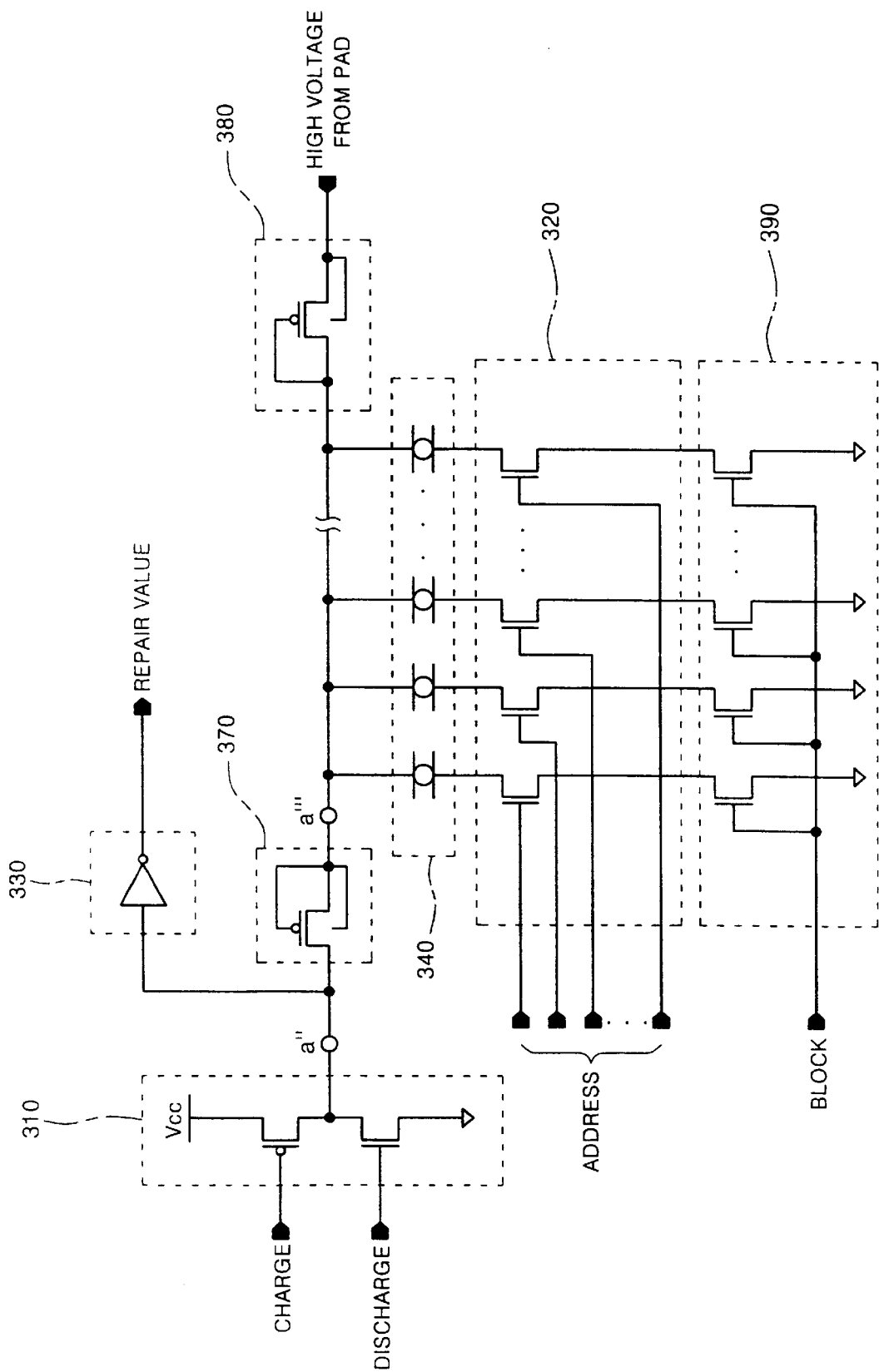
FIG. 4 is a circuit diagram showing another embodiment of the present invention, in which a block selecting function of a bank of anti-fuses is included.

Referring to FIG. 4, which is a circuit diagram illustrating an embodiment of the present invention including a select function of the plurality of anti-fuses 340, the row (X) and column (Y) addresses of redundant cells are selected according to the programming of the anti-fuses. Similarly, a block (or memory bank) address may also be selected. That is, since the anti-fuses 340 to select the column address of a redundant cell differ from normal cells in terms of the occupying chip area, a circuit such as a bank selector 390 for selecting the anti-fuses is necessary.

Moreover, while a laser repair system mechanically selects the anti-fuses 340 to repair a defective cell, an electrical repair, as in the case of an EPROM, requires an anti-fuse selection function. Accordingly, this embodiment is constructed such that a block (or bank) select signal can also be input to select the anti-fuses 340, thereby performing the repair and detecting whether the repair is completed by selecting a predetermined bank of anti-fuses 340 among several such banks.

Figure 5:
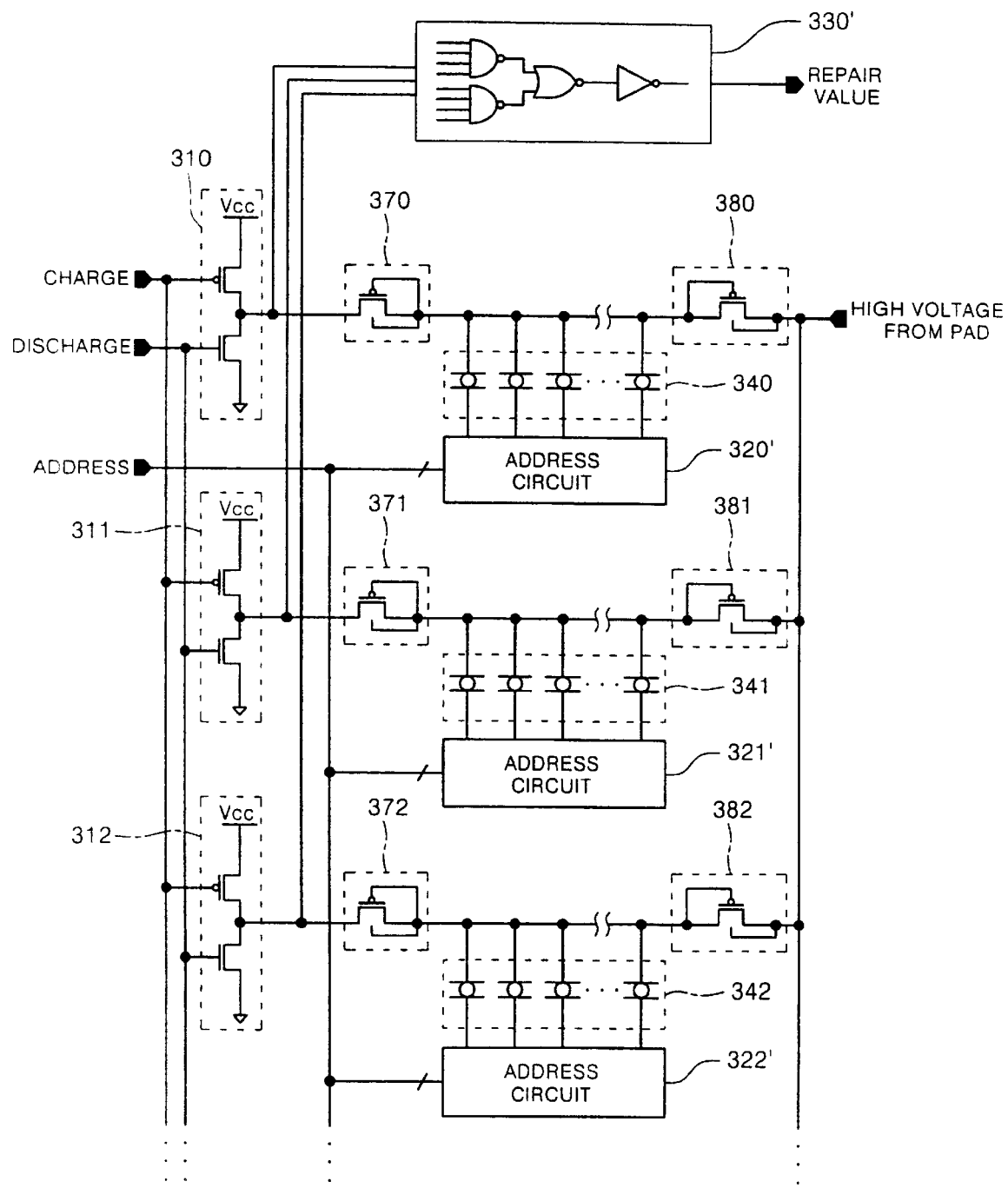
FIG. 5 is a circuit diagram of a repair circuit for a semiconductor memory device adopting the principles of the present invention.

Referring to the embodiment of FIG. 5, the repair circuit of the present invention comprises a plurality of parallel circuits, including: operation switches 310, 311, 312, etc., each connected to the charge/discharge signal input; address circuits 320¢, 321¢, 322¢, etc., each receiving the address selection signal; anti-fuses 340, 341, 342, etc.; first buffers 370, 371, 372, etc.; and second buffers 380, 381, 382, etc., each connected to the high-voltage supply means. In this embodiment, an output unit 330¢ is provided, whose inputs are respectively connected to the common nodes of the operation switches and first buffers, which correspond to the node $a^2$ of FIGS. 3 and 4. A multiple-port output unit 330¢ is comprised of a logic circuit of NAND gates, NOR gates, and at least one invertor, to receive a plurality of voltages in order to determine one repair value for output.

The number of anti-fuses varies according to the number of address lines. That is, if the number of address lines is two, the number of anti-fuses is four (or $2^2$); for three address lines, the number of anti-fuses is eight (or $2^3$); and so on, in the same manner. Accordingly, a plurality of anti-fuses 340 are connected, to be integrated into one array in order to identify the repair value result for a corresponding number of addresses. Here, an address circuit 320¢ may include the bank selector 390 of FIG. 4.

As described above, according to the present invention, the repair circuit allows the anti-fuses to be programmed by an externally supplied high voltage, thereby replacing a defective cell in a memory device with a redundant cell. A pair of buffers are provided to prevent the internal circuitry from being damaged when the high voltage is applied and thereby improves reliability. In addition, the repair circuit enables the reduction of the occupied area, thereby increasing chip productivity.

Since the present invention may be embodied in various forms, without departing from the essential characteristics thereof, it should be understood that the above-described embodiment is not to be limited by any of the details of the foregoing description, unless otherwise specified, but should be construed only as defined in the appended claims. Thus, all modifications that fall within the scope of the claims are therefore intended to be embraced thereby.

What is claimed is:

1. A repair circuit of a semiconductor memory device, for generating a repair value based on an address signal being input to the memory device, comprising:
    an operation switch having an output node for outputting a charge voltage in response to a charge/discharge signal;
    at least one programming circuit of a series connection of an anti-fuse and a transistor, connected between the output of said operation switch and ground, to set a programmed state of the anti-fuse according to the address signal;
    means for supplying an externally generated high voltage to the anti-fuse of said at least one programming circuit;
    a first buffer, connected between said at least one programming circuit and said operation switch, to transmit the charge voltage output to said at least one programming circuit and to block the externally generated high voltage supplied to said at least one programming circuit;
    a second buffer, connected between said at least one programming circuit and said high-voltage supply means, to transmit the externally generated high voltage and to block the charge voltage output to said at least one programming circuit; and
    an output unit to output the repair value, the repair value being indicative of the programmed state set by said at least one programming circuit.

2. The repair circuit as claimed in claim 1, wherein said output unit has an input to receive a voltage representative of the repair value, the input of said output unit being connected to a common node of said operation switch and said first buffer.

3. The repair circuit as claimed in claim 1, wherein said output unit comprises a logic invertor.

4. The repair circuit as claimed in claim 1, wherein said first buffer comprises a PMOS transistor whose source, gate and, substrate are connected to said at least one programming circuit.

5. The repair circuit as claimed in claim 1, wherein said second buffer comprises a PMOS transistor whose source and substrate are connected to said high-voltage supply means and whose drain and gate are connected to said programing circuit.

6. The repair circuit as claimed in claim 1, wherein the transistor of said at least one programming circuit is an NMOS transistor.

7. The repair circuit as claimed in claim 1, wherein said operation switch comprises a PMOS transistor and an NMOS transistor connected in series between a supply voltage and ground, the output node of said operation switch being connected to the common node of the PMOS transistor and the NMOS transistor.

8. The repair circuit as claimed in claim 1, further comprising a bank selector, connected between said at least one programming circuit and ground, to select one bank of anti-fuses in response to a block address signal.

9. The repair circuit as claimed in claim 1, further comprising:
    a parallel circuit comprising:
        a plurality of said operation switches, each receiving the charge/discharge signal;
        a plurality of said at least one programming circuits, each receiving the address selection signal;
        a plurality of said first buffers; and
        a plurality of said second buffers, each receiving the externally generated high-voltage.

10. The repair circuit as claimed in claim 9, where said output unit is a multiple-port output unit, whose inputs are respectively connected to common nodes of said plurality of operation switches and first buffers, comprising a logic circuit of NAND gates, NOR gates, and at least one invertor, to receive a plurality of charge voltage to determine the repair value.

11. The repair circuit as claimed in claim 8, further comprising:
    a parallel circuit comprising:
        a plurality of said operation switches, each receiving the charge/discharge signal;
        a plurality of said at least one programming circuits, each receiving the address selection signal;
        a plurality of said first buffers; and
        a plurality of said second buffers, each receiving the externally generated high-voltage.

12. The repair circuit as claimed in claim 11, where said output unit is a multiple-port output unit, whose inputs are respectively connected to common nodes of said plurality of operation switches and first buffers, comprising a logic circuit of NAND gates, NOR gates, and at least one invertor, to receive a plurality of charge voltage to determine the repair value.

* * * * *